(12) United States Patent
Felix et al.

(10) Patent No.: US 9,766,649 B2
(45) Date of Patent: Sep. 19, 2017

(54) CLOSED LOOP DYNAMIC VOLTAGE AND FREQUENCY SCALING

(71) Applicant: NVIDIA Corporation, Santa Clara, CA (US)

(72) Inventors: Stephen Felix, Bristol (GB); Jeffery Bond, Barry (GB); Tezaswi Raja, San Jose, CA (US); Kalyana Bollapalli, San Jose, CA (US); Vikram Mehta, Cupertino, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/947,999

(22) Filed: Jul. 22, 2013

(65) Prior Publication Data

US 2015/0022272 A1    Jan. 22, 2015

(51) Int. Cl.
*H03L 1/00* (2006.01)
*G06F 1/08* (2006.01)
*G06F 1/32* (2006.01)

(52) U.S. Cl.
CPC .............. *G06F 1/08* (2013.01); *G06F 1/324* (2013.01); *G06F 1/3296* (2013.01); *H03L 1/00* (2013.01); *Y02B 60/1217* (2013.01); *Y02B 60/1285* (2013.01)

(58) Field of Classification Search
CPC .................. G05F 1/10; G05F 3/02; H03L 1/00
USPC ......... 327/530, 534, 535, 537–543; 331/175, 331/185, 186
See application file for complete search history.

(56) References Cited

U.S. PATENT DOCUMENTS

| | | |
|---|---|---|
| 4,958,269 A | 9/1990 | Gritter |
| 5,272,649 A | 12/1993 | Campbell et al. |
| 5,275,919 A | 1/1994 | Kawatsuji et al. |
| 5,542,240 A | 8/1996 | Snider et al. |
| 5,690,139 A | 11/1997 | Murphy et al. |
| 5,691,662 A | 11/1997 | Soboleski et al. |
| 5,760,636 A | 6/1998 | Noble et al. |
| 5,787,006 A | 7/1998 | Chevallier et al. |

(Continued)

FOREIGN PATENT DOCUMENTS

| | | |
|---|---|---|
| DE | 102011102238 | 12/2011 |
| GB | 2481492 | 12/2011 |

OTHER PUBLICATIONS

Sark, Junyoung; et al. A Fast, Accurate and Simple Critical Path Monitor for Improving Energy-Delay Product in DVS Systems; IEEE; 2011; 6 pages.

(Continued)

*Primary Examiner* — Levi Gannon

(57) ABSTRACT

A system is based on an IC. A first component of the IC generates a signal that clocks the IC at a target operating frequency. A period corresponding to the target clock frequency exceeds a duration of a longest critical path associated with the IC. The first component and synchronous logic of the IC clocked therewith, each functions with the core supply voltage, which may be supplied to each via the same power supply rail. A second IC component detects errors that relate to an operation of the IC at the target clock frequency and determines a level for adjusting the core supply voltage. The Vdd adjustment ameliorates the frequency error. The voltage determination uses closed loop dynamic voltage and frequency scaling.

22 Claims, 8 Drawing Sheets

(56) References Cited

U.S. PATENT DOCUMENTS

| | | | |
|---|---|---|---|
| 5,889,529 A | 3/1999 | Jones et al. | |
| 6,080,206 A | 6/2000 | Tadokoro et al. | |
| 6,111,756 A | 8/2000 | Moresco | |
| 6,157,247 A * | 12/2000 | Abdesselem et al. | 327/540 |
| 6,198,635 B1 | 3/2001 | Shenoy et al. | |
| 6,272,649 B1 | 8/2001 | Hayward et al. | |
| 6,275,919 B1 | 8/2001 | Johnson | |
| 6,313,675 B1 | 11/2001 | Naffziger | |
| 6,397,375 B1 | 5/2002 | Block et al. | |
| 6,535,071 B2 | 3/2003 | Forbes | |
| 6,549,240 B1 | 4/2003 | Reitmeier | |
| 6,690,139 B1 | 2/2004 | Seibel | |
| 6,734,744 B2 | 5/2004 | Monzel et al. | |
| 6,831,494 B1 | 12/2004 | Fu et al. | |
| 6,882,172 B1 | 4/2005 | Suzuki et al. | |
| 6,885,210 B1 | 4/2005 | Suzuki | |
| 6,898,770 B2 | 5/2005 | Boluki et al. | |
| 6,903,564 B1 | 6/2005 | Suzuki | |
| 6,985,025 B1 * | 1/2006 | Maksimovic et al. | 327/540 |
| 7,024,568 B2 * | 4/2006 | Maksimovic et al. | 713/300 |
| 7,038,483 B1 | 5/2006 | Suzuki et al. | |
| 7,061,292 B2 * | 6/2006 | Maksimovic et al. | 327/277 |
| 7,080,271 B2 | 7/2006 | Kardach et al. | |
| 7,085,658 B2 | 8/2006 | Bhushan et al. | |
| 7,095,288 B2 * | 8/2006 | Smith | 331/74 |
| 7,107,200 B1 | 9/2006 | Korobkov | |
| 7,126,365 B2 | 10/2006 | Suzuki | |
| 7,129,763 B1 * | 10/2006 | Bennett et al. | 327/262 |
| 7,149,903 B1 * | 12/2006 | Chan et al. | 713/300 |
| 7,151,417 B1 | 12/2006 | Suzuki | |
| 7,161,812 B1 | 1/2007 | Thomas | |
| 7,212,022 B2 | 5/2007 | Suzuki | |
| 7,235,998 B1 | 6/2007 | Suzuki | |
| 7,281,232 B1 | 10/2007 | Nicolino, Jr. et al. | |
| 7,315,178 B1 | 1/2008 | Suzuki | |
| 7,330,080 B1 | 2/2008 | Stoiber et al. | |
| 7,414,485 B1 | 8/2008 | Masleid | |
| 7,417,482 B2 | 8/2008 | Elgebaly et al. | |
| 7,454,735 B2 | 11/2008 | Arthanari et al. | |
| 7,456,628 B2 | 11/2008 | Suzuki | |
| 7,467,367 B1 | 12/2008 | Li et al. | |
| 7,501,868 B2 * | 3/2009 | Ito | 327/158 |
| 7,574,613 B2 | 8/2009 | Holle et al. | |
| 7,627,730 B1 | 12/2009 | Moll | |
| 7,636,023 B1 | 12/2009 | Suzuki | |
| 7,642,866 B1 | 1/2010 | Masleid | |
| 7,667,478 B2 | 2/2010 | Suzuki | |
| 7,739,531 B1 | 6/2010 | Krishnan | |
| 7,768,356 B2 | 8/2010 | Masleid | |
| 7,774,732 B2 | 8/2010 | KleinOsowski et al. | |
| 7,839,410 B1 | 11/2010 | Brown et al. | |
| 7,868,638 B2 | 1/2011 | Suzuki | |
| 7,889,014 B1 | 2/2011 | Stoiber et al. | |
| 8,008,961 B2 | 8/2011 | Garg et al. | |
| 8,055,871 B1 | 11/2011 | Schulze et al. | |
| 8,125,261 B2 * | 2/2012 | Nomura | 327/270 |
| 8,134,356 B2 * | 3/2012 | Dobberpuhl et al. | 324/76.39 |
| 8,193,798 B1 | 6/2012 | Pace et al. | |
| 8,370,663 B2 | 2/2013 | Frid et al. | |
| 8,593,197 B1 | 11/2013 | Cheng | |
| 8,624,680 B2 | 1/2014 | Stoiber et al. | |
| 8,656,198 B2 | 2/2014 | Branover et al. | |
| 8,775,843 B2 | 7/2014 | Frid et al. | |
| 2002/0024828 A1 | 2/2002 | Hayashi et al. | |
| 2002/0126751 A1 | 9/2002 | Scheurich et al. | |
| 2002/0188920 A1 | 12/2002 | Lampaert et al. | |
| 2003/0004921 A1 | 1/2003 | Schroeder | |
| 2003/0030483 A1 * | 2/2003 | Seki et al. | 327/540 |
| 2003/0156639 A1 | 8/2003 | Liang | |
| 2004/0010330 A1 | 1/2004 | Chen | |
| 2004/0057324 A1 | 3/2004 | Abe et al. | |
| 2004/0078773 A1 | 4/2004 | Sharma et al. | |
| 2004/0123171 A1 | 6/2004 | Zhang et al. | |
| 2005/0012556 A1 | 1/2005 | Bhushan et al. | |
| 2005/0021656 A1 | 1/2005 | Callegari | |
| 2005/0024155 A1 | 2/2005 | Huang | |
| 2005/0036246 A1 | 2/2005 | Nagata et al. | |
| 2005/0057314 A1 | 3/2005 | Hsu et al. | |
| 2005/0057551 A1 | 3/2005 | Gong et al. | |
| 2005/0097497 A1 | 5/2005 | Schlansker et al. | |
| 2005/0271361 A1 | 12/2005 | Aoki et al. | |
| 2006/0031699 A1 | 2/2006 | Arthanari et al. | |
| 2006/0097795 A1 | 5/2006 | Sohn | |
| 2006/0156266 A1 | 7/2006 | Alpert et al. | |
| 2006/0246895 A1 | 11/2006 | Ryu | |
| 2006/0284657 A1 | 12/2006 | Park et al. | |
| 2006/0288323 A1 | 12/2006 | Birch | |
| 2007/0001697 A1 | 1/2007 | Dobberpuhl et al. | |
| 2007/0157144 A1 | 7/2007 | Mai et al. | |
| 2007/0206018 A1 | 9/2007 | Bajic et al. | |
| 2007/0220289 A1 | 9/2007 | Holle et al. | |
| 2007/0234088 A1 | 10/2007 | Marshall et al. | |
| 2008/0204158 A1 * | 8/2008 | Weder | 331/177 V |
| 2009/0077402 A1 | 3/2009 | Huang et al. | |
| 2009/0204830 A1 | 8/2009 | Frid et al. | |
| 2009/0271752 A1 | 10/2009 | Alpert et al. | |
| 2010/0019818 A1 | 1/2010 | Priel et al. | |
| 2010/0019834 A1 * | 1/2010 | Zerbe et al. | 327/538 |
| 2010/0095137 A1 | 4/2010 | Bieswanger et al. | |
| 2010/0182055 A1 | 7/2010 | Rozen et al. | |
| 2010/0231306 A1 | 9/2010 | Goodnow et al. | |
| 2010/0250972 A1 | 9/2010 | Freitas | |
| 2010/0318828 A1 | 12/2010 | Elting et al. | |
| 2011/0032008 A1 | 2/2011 | Zhao et al. | |
| 2011/0110000 A1 | 5/2011 | Etter | |
| 2011/0161901 A1 | 6/2011 | Berry et al. | |
| 2011/0181325 A1 | 7/2011 | May et al. | |
| 2011/0199159 A1 | 8/2011 | Rozen et al. | |
| 2011/0320839 A1 | 12/2011 | David et al. | |
| 2012/0013408 A1 | 1/2012 | Cortadella et al. | |
| 2012/0054519 A1 | 3/2012 | Branover et al. | |
| 2012/0105452 A1 | 5/2012 | Diard | |
| 2012/0110351 A1 | 5/2012 | Raju et al. | |
| 2012/0188233 A1 | 7/2012 | Shuster et al. | |
| 2012/0223940 A1 | 9/2012 | Dunstan et al. | |
| 2012/0306877 A1 | 12/2012 | Rosasco | |
| 2013/0002838 A1 | 1/2013 | Takenaka | |
| 2013/0035797 A1 | 2/2013 | Allen-Ware et al. | |
| 2013/0097443 A1 | 4/2013 | Li et al. | |
| 2013/0152035 A1 | 6/2013 | Berry et al. | |
| 2013/0179711 A1 | 7/2013 | Aelion et al. | |
| 2013/0212417 A1 | 8/2013 | Frid et al. | |
| 2013/0311799 A1 | 11/2013 | Fitzpatrick et al. | |
| 2014/0032947 A1 | 1/2014 | Ahmad et al. | |
| 2014/0043333 A1 | 2/2014 | Narayanan et al. | |
| 2014/0184626 A1 | 7/2014 | Narayanan et al. | |
| 2014/0266460 A1 | 9/2014 | Nobbe et al. | |
| 2015/0022272 A1 | 1/2015 | Felix et al. | |
| 2015/0049519 A1 | 2/2015 | Izadian | |
| 2016/0380619 A1 | 12/2016 | Bollapalli et al. | |

OTHER PUBLICATIONS

Stiles, "10.3 CMOS Logic Gate Circuits", 2004, The University of Kansas, Dept. of EECS, retrieved from http://www.ittc.ku.edu~jstiles/312/handouts/section_10_3_CMOS_Logic_Gate_Circuits_package.pdf.

* cited by examiner

CLOSED LOOP DYNAMIC VOLTAGE AND FREQUENCY SCALING

TECHNOLOGY

Embodiments of the present invention relate generally to processor power management. Example embodiments of the present invention relate more particularly to dynamic voltage and frequency adjustment for power management in an integrated circuit device.

BACKGROUND

Integrated circuit (IC) devices include "mobile chips," e.g., an IC device that is designed as a processing component, such as a central processing unit (CPU) for mobile or cellular communication or computing systems. Mobile chips and other IC devices may use active power management schemes to control, regulate and optimize power related characteristics of the devices.

Typical IC devices comprise a semiconductor die. An array of active device and addressable memory cell components (e.g., transistors) are disposed therein. The active and addressable components are operably configured within the array with an interconnective network conductive traces and vias. Conductive pads and leads allow signal inputs and outputs from the IC.

In general, sub-microscopic technology development diminishes the physical dimensions of IC devices even as the switching and logic frequencies and power consumption thereof rise. Smaller dimensions and faster logic and switching are particularly valuable in mobile chips, which comprise components in telephones, pad computers, personal digital assistants (PDA) and the like.

However, greater switching frequencies and power consumption may degrade reliability and/or performance in IC devices with such small, sub-microscopic dimensions. The inductance of conductive leads, for instance, may suffice to develop related di/dt voltage drops. These voltage drops may inject voltage related noise, which reduces noise margins and switching speeds.

Noise that is injected by di/dt voltage drops (hereinafter, "di/dt noise") is voltage related noise, which may reach significant levels in relation to the core supply voltage (Vdd) of a multi-core CPU. FIG. 1 graphs an example di/dt noise profile 10. Noise profile 10 represents a pair of corresponding current (Idyn) and voltage (Vdd_cpu) noise waveforms that may characterize Vdd for an example 4-core CPU, which develops di/dt noise levels of as high as 20 percent of Vdd or more.

Significant noise signatures may constrain or limit the effective upper operating frequency that a CPU may achieve or sustain. This frequency constraint relates to maintaining sufficient timing margins to clock accurately even the CPU's fastest running logic and switching operations without error or failure. In some CPUs, dynamic voltage and frequency scaling (DVFS) may be used to help maintain sufficient timing margins, reactively in relation to di/dt noise on Vdd.

DVFS tables for the CPU domain are currently defined in software. For example, DVFS tables may group data tabulated therewith, e.g., using a per bin basis in which the data are at least partially quantized on the basis of the voltage levels they represent. The DVFS tables specify the Vdd voltage levels that are needed by all of the CPU components, which are tabulated in each of the bins, to run at any of a range of given frequencies.

This approach essentially involves adding an extra voltage margin for all parts in each of the bins to compensate for the slowest part in the bin. However, this extra voltage margin demands higher power, which raises temperatures and represents diminished efficiency.

Approaches described in this section could, but have not necessarily been conceived or pursued previously. Unless otherwise indicated, neither approaches described in this section, nor issues identified in relation thereto, are to be assumed as recognized in any prior art merely by inclusion therein.

SUMMARY

Power management for an IC device is described herein. In particular, an example embodiment of the present invention is described in relation to closed loop dynamic voltage and frequency scaling for power management in a processing device, such as a central processing unit (CPU).

An example embodiment of the present invention thus automatically programs desired (e.g., requested) target processor operational frequencies. An example embodiment effectively functions with feedback, which determines the optimal processor operational voltage automatically for a requested target frequency.

Any component of an IC device, notwithstanding its characteristics and corresponding classification in any bin, is thus run at its optimal voltage for a given frequency, which conserves power and minimizes current draw and associated local and general temperature rises. Thus, an example embodiment of the present invention provides, in effect, a per-part voltage identification (VID) binning capability for an IC device.

A system is based on an IC. A first component of the IC generates a signal that clocks the IC at a target operating frequency. A period corresponding to the target clock frequency exceeds a duration of a longest critical path associated with the IC. The first component and synchronous logic of the IC clocked therewith, each functions with the core supply voltage, which may be supplied to each via the same power supply rail.

A second IC component detects errors that relate to an operation of the IC at the target clock frequency and determines a level for adjusting the core supply voltage. The Vdd adjustment ameliorates the frequency error. The voltage determination uses closed loop dynamic voltage and frequency scaling.

The system includes a second component for detecting errors that relate to an operation of the IC at the target operation clock frequency and for determining a level for adjusting the core supply voltage. The voltage determination comprises closed loop dynamic voltage and frequency scaling (e.g., CL_DVFS).

The core supply voltage adjustment ameliorates the frequency related error. An example embodiment of the present invention thus automatically programs desired (e.g., requested) target frequencies. An example embodiment effectively functions with feedback, which determines the optimal voltage automatically for a requested target frequency.

In an example embodiment, the first component comprises a digitally parameterizable voltage controlled oscillator (DVCO) that, based on the determined level for adjusting the core supply voltage, outputs the clock signal. The second component controls the DVCO, based on the determined level for adjusting the core supply voltage and outputs a signal that corresponds to the determined level for adjusting the core supply voltage.

The system may function with an entity that controls or regulates the core supply voltage based on the output signal, which corresponds to the determined level for adjusting the core supply voltage, which may be independent of the IC. An example embodiment may be implemented wherein the core supply voltage control or regulation entity comprises a power management IC (PMIC) component, which may be electrically and communicatively coupled for exchanging signals with the system, e.g., as independently disposed or mounted components on a printed circuit board (PCB).

The second component provides the output signal, which corresponds to the determined level for adjusting the core supply voltage, to the core supply voltage control or regulation entity.

The frequency related errors comprise a deviation of an output frequency of the DVCO from the target operation clock frequency. The second component may comprise a cycle-error integrator, which detects the errors that relate to an operation of the IC at the target operation clock frequency.

The second component may also comprise one or more registers, which store a value that relates to the target clock operation frequency, a parameter that relates to tuning the second component, and/or a parameter that relates to a gain, which is achieved in the second component.

BRIEF DESCRIPTION OF THE DRAWINGS

Embodiments of the present invention, which relate to closed loop dynamic voltage and frequency scaling for power management in a processing device, are illustrated by way of example, but not limitation, with reference to the figures (FIG.) that are shown the accompanying drawings. "These figures comprise a part of the present specification, in which like identifying reference numerals refer to similar elements and features of example embodiments described herein, and in which.

DESCRIPTION OF EXAMPLE EMBODIMENTS

Figure 1:
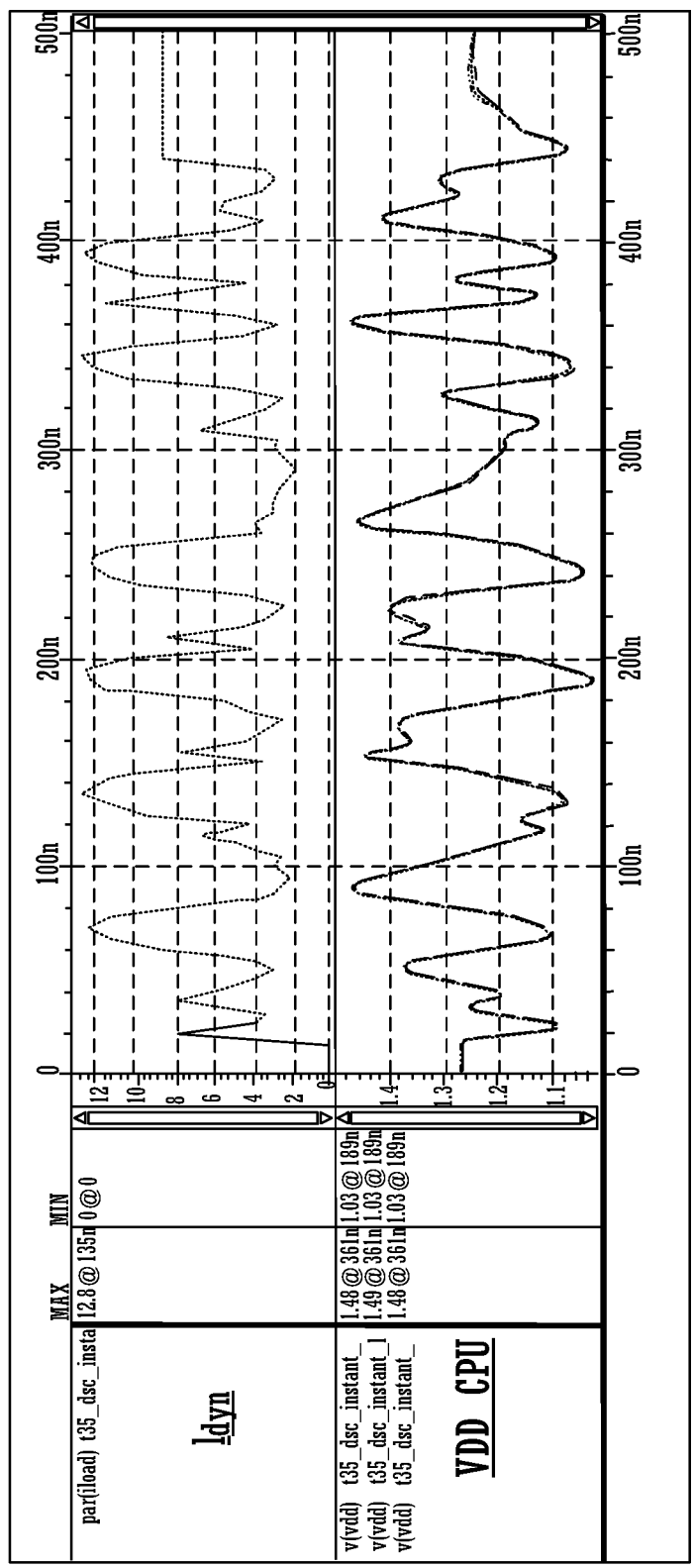
FIG. 1 graphs an example di/dt noise profile.

Power management for an IC device is described herein. In particular, an example embodiment of the present invention is described in relation to closed loop dynamic voltage and frequency scaling for power management in a processing device, such as a CPU. In the description that follows, numerous specific details are set forth for the purposes of explanation in order to provide a thorough understanding of example embodiments the present invention.

Artisans of ordinary skill in IC device related technologies may realize that example embodiments may be practiced without some of these specifically described details. For focus, clarity and brevity, and to avoid unnecessarily occluding, obscuring, obstructing or obfuscating features that may be somewhat more germane or significant in explaining an example embodiment of the present invention, this description may avoid describing some well-known processes, structures, components, systems, devices or techniques in exhaustive detail.

Overview

Power management for an IC device is described herein. In particular, an example embodiment of the present invention is described in relation to closed loop dynamic voltage and frequency scaling for power management in a processing device, such as a CPU.

An example embodiment of the present invention thus automatically programs desired (e.g., requested) target frequencies. An example embodiment effectively functions with feedback, which determines the optimal voltage automatically for a requested target frequency.

A system is based on an IC. A first component of the IC generates a signal that clocks the IC at a target operating frequency. A period corresponding to the target clock frequency exceeds a duration of a longest critical path associated with the IC. The first component and synchronous logic of the IC clocked therewith, each functions with the core supply voltage, which may be supplied to each with the same power supply rail.

A second IC component detects errors that relate to an operation of the IC at the target clock frequency and determines a level for adjusting the core supply voltage. The Vdd adjustment ameliorates the frequency error. The voltage determination uses closed loop dynamic voltage and frequency scaling (e.g., CL_DVFS).

The core supply voltage adjustment ameliorates the frequency related error. An example embodiment of the present invention thus automatically programs desired (e.g., requested) target frequencies. An example embodiment effectively functions with feedback, which determines the optimal voltage automatically for a requested target frequency.

Any component of an IC device, notwithstanding its characteristics and corresponding classification in any bin, is thus run at its optimal voltage for a given frequency, which conserves power and minimizes current draw and associated local and general temperature rises. Thus, an example embodiment of the present invention provides, in effect, a per-part VID binning capability for an IC device.

In an example embodiment of the present invention, a DVCO is adjusted using digital settings to match the longest critical setup timing path(s) in an IC design across variations in voltage, temperature and non-static, variable or less stable process characteristics (e.g., systematic and/or random) associated therewith. An example embodiment is implemented wherein a sensitivity is adjusted in relation to the DVCO's speed or responsiveness to various process parameters. Such process parameters may include (but are not limited to) interconnect resistance and capacitance and threshold voltage and mobility characteristics of various types of metal oxide semiconductor field effect transistor (MOSFET) components of the IC, including those used in static random access memory (SRAM) and logic circuits. These process parameters also may vary independently in production; some perhaps significantly. The worst (e.g., longest) specific critical setup timing path that sets the minimum clock cycle time can vary with voltage, temperature and various, non-static, variable or less stable process characteristics (systematic and/or random). An example embodiment is implemented with a voltage controlled oscillator (VCO) that models the behavior of multiple, changeable, variable setup timing pathways, e.g., the digitally parameterizable VCO (DVCO).

Example Embodiments

Figure 2:
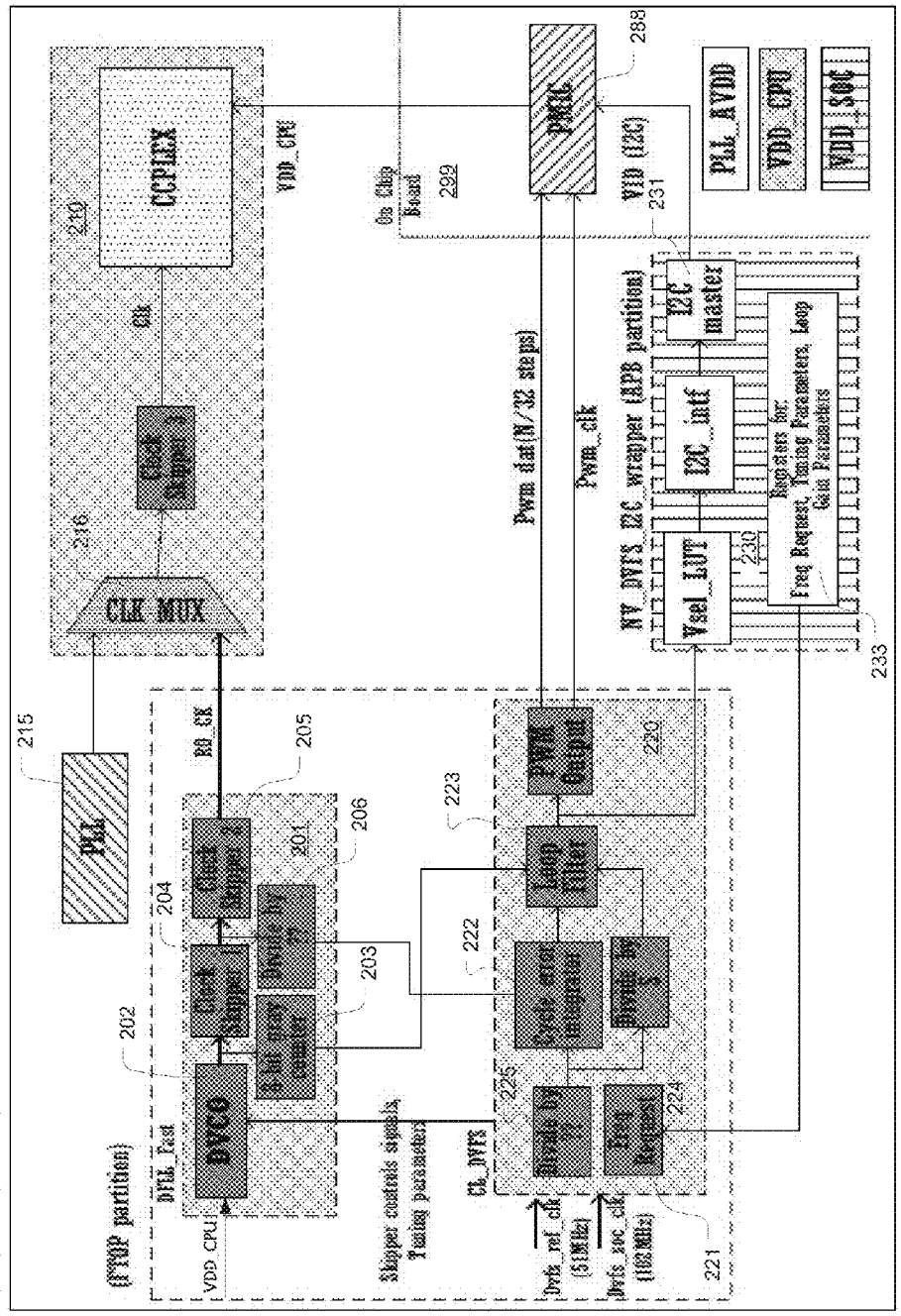
FIG. 2 depicts an example IC based system, according to embodiments of the present invention.

FIG. 2 depicts an example IC based system 200, according to an embodiment of the present invention. System 200 is disposed in an IC device 210, which may be coupled electrically and communicatively for the exchange of signals and/or power (e.g., Vdd) with a circuit board (PCB) 299. IC device 210 may implement, for example, a mobile chip or another CPU or processor.

A power management IC (PMIC) device 288 may also be coupled electrically and communicatively for the exchange of signals and/or power (e.g., Vdd) with a circuit board (PCB) 299. Although coupled independently (e.g., in relation to each other) with PCB 299, IC device 210 and PMIC device 288 may exchange signals and power between them.

System 200 and exchanges signals and interacts functionally with PMIC 288 so as to manage the power for IC device 210. An example embodiment may be implemented wherein a component of system 200 exchanges signals and interacts functionally with PMIC 288 with a pulse width modulation (PWM) and/or an inter-integrated circuit ($I^2C$) interface.

System 200 comprises a first component 201. Component 201 functions at Vdd and generates a clock (Clk) signal for clocking IC 210 at a target frequency for operation. A period $1/f_{target}$ corresponds to the target operation clock frequency $f_{target}$ and exceeds a critical path function or operation duration of IC 210.

An example embodiment may be implemented wherein component 201 performs as a dynamic frequency locked loop (DFLL) function. Component 201 may thus comprise a digitally parameterizable voltage controlled oscillator (DVCO) 202 and a frequency counter 203. DVCO 202 is supplied with the core supply voltage Vdd_cpu.

The attributes of DVCO 202 in relation to its 'frequency versus (vs.) supply voltage' performance or operation, such as its frequency vs. supply voltage curve, are configured to match closely the frequency vs. supply voltage characteristics of the critical path of the IC 210. Thus, an embodiment may be implemented wherein DVCO 202 comprises a configurable quantity and type of delay elements.

Critical paths within IC device 210 change dynamically in relation to variations in voltage, temperature and/or other conditions that may characterize the operations of IC 210 over time. DVCO 202 comprises a plurality of parallel tunable paths that are configured or reconfigured in such a way that the output clock frequency from DVCO 201 is determined in relation to the critical path of IC device 210 that has the longest duration. In an example embodiment therefore, DVCO 201 provides a clock signal with a frequency that has a corresponding period, which exceeds the duration of the slowest critical path in the operation of IC device 210.

An example embodiment may be implemented wherein, in addition to DFLL 201, IC device 210 has another clock, which comprises a phase locked loop (PLL) 215 that outputs a clock signal PLL_Clk. A multiplexer (Mux) 216 multiplexes the DFLL 201 output clock signal with the PLL_Clk clock signal from PLL 215 to clock a timing module CCPLEX of IC device 210. Thus, DFLL 201 is selectable as an alternative (or in addition) to PLL 215 for clocking IC device 210.

DFLL 201 comprises a first clock skipper 204, which functions to control di/dt noise. While example embodiments are described herein in relation di/dt noise, it is appreciated that this description is presented by way of example and explanation (but not for any limiting purpose). In fact, an example embodiment of the present invention is well suited to apply over any type of voltage related noise, which is appreciated as represented herein with descriptive reference to di/dt noise.

DFLL-201 comprises a second clock skipper 205, which functions during low frequency operations of IC device 210, such as conditions wherein operating speed of DVCO 202 exceeds the target operating frequency, e.g., the desired frequency for operating, IC device 210.

System 200 comprises a second component 220. Component 220 functions to detect errors that relate to an operation of IC device 210 at the target operation clock frequency. For example, the errors may comprise a deviation of an output frequency of the DVCO from the target operation clock frequency. Further, component 220 functions to determine a level for adjusting the core supply voltage Vdd, with which the frequency related error is ameliorated (e.g., corrected or minimized and thus, improved). In example embodiments of the present invention, the voltage determination comprises closed loop dynamic voltage and frequency scaling (CL_DVFS).

In an example embodiment, CL_DVFS component 220 functions to control DVCO 202, based on the determined level for adjusting the core supply voltage Vdd, and outputs a signal that corresponds to the determined level for adjusting Vdd.

CL_DVFS 220 comprises control logic for achieving and maintaining operation. An example embodiment may be implemented wherein CL_DVFS component 220 receives inputs that comprise the clock signal output of DFLL 201 and a reference clock, which maintains a constant frequency (e.g., 51 MHz). An example embodiment may be implemented wherein a divider 225 divides the input, which corresponds to the DFLL 201 clock signal output to CL_DVFS 220.

An example embodiment may be implemented wherein CL_DVFS component 220 comprises a frequency request register (FRR) 221 for storing values that relate to the target, e.g., desired operating frequency. FRR 221 may comprise encoded instructions that are stored tangibly, e.g., in memory cells that are associated with CL_DVFS component 220.

CL_DVFS comprises a cycle-error integrator 222. Cycle error integrator 222 detects the errors that relate to an operation of the IC at the target operation clock frequency. For example, cycle error integrator 222 functions to measure a deviation of DFLL 201 output frequency from the desired, e.g., target operation clock frequency.

Based on an error signature, e.g., a sign and magnitude that correspond to the detected frequency related error, CL_DVFS 220 determines a level for adjusting the voltage on the timing module of IC device 210. An example embodiment may be implemented wherein CL_DVFS component 220 combines the error signature with parameters such as loop gain and error tolerance in its control logic to determine the voltage adjustment level.

An example embodiment may be implemented wherein CL_DVFS component 220 comprises a loop filter 223. A divider 224 may further divide the clock signal output of DFLL 201, which was divided upon its input to CL_DVFS 220 with the divider 225.

An example embodiment may be implemented wherein CL_DVFS 220 functions with an entity that, based on the output signal of CL_DVFS 220, controls or regulates the core supply voltage Vdd. The core supply voltage control or regulation entity may comprise a device or a component that is independent of IC device 210.

For example, the core supply voltage control or regulation entity may comprise a PMIC device or component 288. PMIC 288 may be disposed (e.g., mounted on and electrically and communicatively coupled to) on a PCB 299, on which IC device 210 is also disposed, independently in relation thereto. The output signal of CL_DVFS 220 corresponds to the determined level for adjusting core supply voltage Vdd so as to ameliorate the effects of the frequency error and is supplied to PMIC device 288.

An example embodiment of the present invention may be implemented wherein the output signal of CL_DVFS 220 comprises a digital signal, which is provided to PMIC 288 via an I$^2$C interface. Alternatively, additionally or optionally, an output signal of CL_DVFS embodiment of the present invention may be implemented wherein 220 comprises a PWM signal, which is provided to PMIC 288. However, an embodiment of the present invention may be implemented wherein the output signal of CL_DVFS 220 is provided exclusively via PWM or via I$^2$C, e.g., but not via both.

In implementing an example embodiment that uses the I$^2$C interface, additional logic translates the voltage adjustment setting into an I$^2$C register format using a look up table (LUT) in a voltage selection and/or an I$^2$C interface module. An I$^2$C master may be integrated into the modules to communicate the voltage adjustment setting, e.g., the new voltage request, to PMIC 288. The I$^2$C master may control PMIC 288 when CL-DVFS 220 is disabled. Arbitration logic thus prevents or deters both CL_DVFS 220 and the I$^2$C master from communicating (e.g., exchanging signals) simultaneously with PMIC 288.

In implementing an example embodiment wherein PWM signalling is used, the output signal of CL_DVFS 220 is communicated with PMIC 288 via a PWM clocking signal pwm_Clk and a PWM data signal pwm_dat. PMIC 288 adjusts the core supply voltage Vdd, e.g., as supplied to the timing control complex CCPLEX, based on this output signal of CL_DVFS 220.

An example embodiment of the present invention may be implemented wherein system 200 functions according to one of at least three operational modes: a closed loop mode, an open loop mode and a disabled mode. In the disabled mode, a selection that relates to Clk Mux 216 is configured to enable clocking IC device 210 using the output of PLL 215 as a primary clock signal and system 200 remains substantially idle or inactive.

Figure 3:
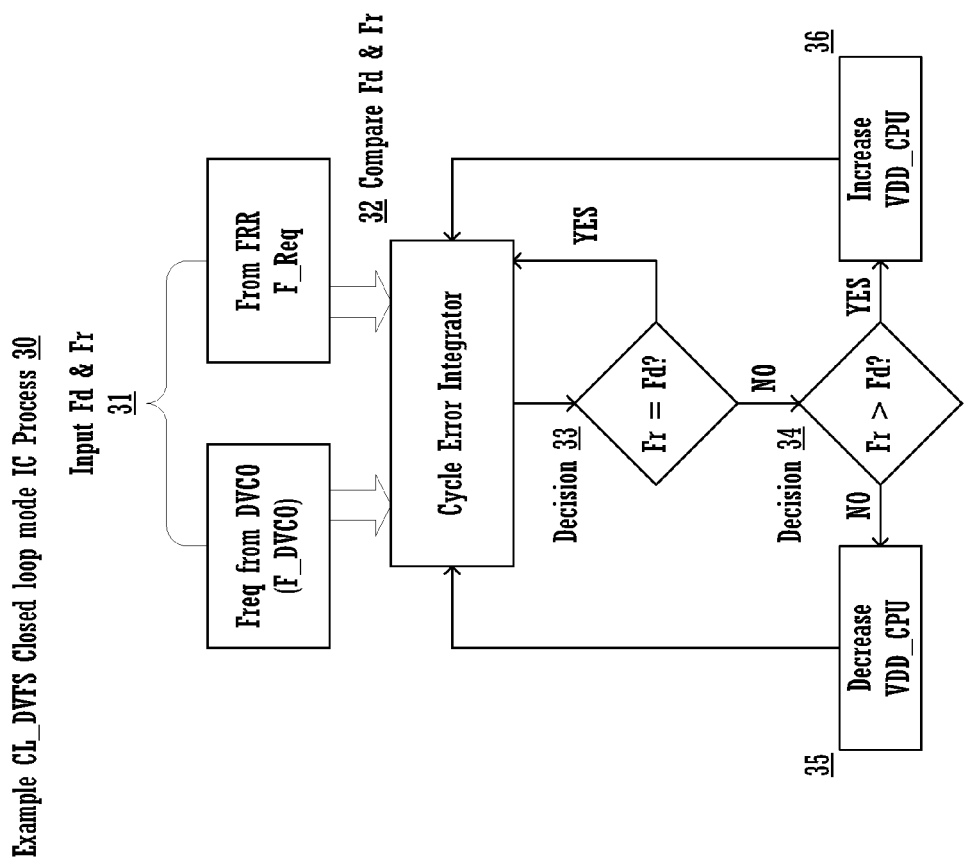
FIG. 3 depicts an example IC based process, according to an embodiment of the present invention.

In a closed loop mode, a selection that relates to Clk Mux 216 is configured to enable clocking IC device 210 using the output signal Dvco_Clk from DFLL 201 as a primary clock signal. FIG. 3 depicts an example IC based CL_DVFS process 300, according to an embodiment of the present invention.

During non-idle operation of the timing control complex CCPLEX, in closed loop mode FRR 221 registers a requested (e.g., desired) target operating frequency for IC 210. The current (e.g., then-existing) clock frequency output signal (Fd) from DVCO 202 and the requested target operating frequency (Fr, also herein: $F_{target}$) comprise inputs 31 to cycle error integrator 222. Cycle error integrator 222 executes a comparison 32 of Fd and Fr. If cycle error integrator 222 returns a decision 33 that, based on comparison 32, Fd and Fr are equal, then the frequency related error is zero and cycle error integrator 222 continues to compare Fd to Fr, e.g., over time.

If cycle error integrator 222 returns a decision 34 that, based on comparison 32, Fr is greater than Fd, then the frequency related error is negative in sign. DVFS 220 thus outputs a voltage adjustment signal 36 that corresponds to the negatively signed error magnitude. The core operating voltage Vdd_cpu is then increased (e.g. by PMIC 288) for IC 210 based on the voltage adjustment signal 36 and cycle error integrator 222 continues to compare Fd to Fr.

If cycle error integrator 222 returns the decision 34 that, based on comparison 32, Fr is not greater (e.g., is less) than Fd, then the frequency related error is positive in sign. DVFS 220 thus outputs a voltage adjustment signal 35 that corresponds to the positively signed error magnitude. The core operating voltage Vdd_cpu is then lowered (decreased) based on the voltage adjustment signal 35 and cycle error integrator 222 continues to compare Fd to Fr.

Thus, if the requested target frequency and the output frequency of DVCO 202 are equal, then the value that cycle error integrator computes is equal, at least approximately, to zero and the system does essentially nothing, e.g., besides continuing to compare Fd to the currently registered Fr value. However, if the DVCO 202 frequency Fd differs from the then-registered requested frequency, CL_DVFS system 200 initiates a voltage change sequence.

As DVCO 202 comprises a free running voltage controlled oscillator, its output frequency is controllable in system 200 by changing the core supply voltage Vdd_cpu of IC 210. Depending on the sign and magnitude of the frequency related error, e.g., based on how fast or slow DVCO 202 is running, as compared to the requested frequency, loop filter module 223 signals a voltage adjustment request to raise or lower the core supply voltage Vdd_cpu.

An example embodiment may be implemented wherein the voltage adjustment request comprises a PWM signal that is generated by PWM controller 226. Alternatively, optionally or additionally, an example embodiment may be implemented wherein the voltage adjustment request is translated into I$^2$C format and communicated, e.g., to PMIC 288, through an I$^2$C master 231 within a DVCO_Ctrl module 230. DVCO_Ctrl module 230 may also comprise registers 233, which store values that are configured for target frequency requests, tuning parameters and/or loop gain parameters.

The voltage control entity (e.g., PMIC 288) then raises or lowers the core control voltage Vdd_cpu, based on the request signalled with the voltage adjustment signal.

As the core supply voltage Vdd_cpu reaches the new requested value, the output frequency Fd of DVCO 202 begins to approach the registered request frequency Fr. Cycle error integrator 222 thus computes a new value for the frequency related error, based on a comparison between the newly adjusted output frequency Fd of DVCO 202 and the registered request frequency Fr.

If the error computed is zero, then system 200 runs without further immediate substantive effect, e.g., beyond simply continuing to compare the input frequencies. If however the computed frequency related error comprises a value other than zero, then system 200 functions to continue raising or lowering the core supply voltage Vdd_cpu voltage, comparing the rising or lowering values of Fd to Fr and computing corresponding update values for the frequency related error repetitively, until the cycle error reaches a value of zero (or essentially so), wherein the DVCO 202 frequency Fd matches the value of the registered target request frequency.

The closed loop operating mode allows system 200 to maintain the target output frequency at a desired value for proper, error free operation of IC device 210. An example embodiment maintains the target frequency with essentially constantly updated adjustments to the core supply voltage Vdd_cpu until the frequency related error between the desired frequency and the frequency output achieved of DVCO 202 reaches a value of zero.

System 200 functions in closed loop mode with some process related considerations, such as minimum and maximum voltage limitation boundaries, which cannot be exceeded. A minimum voltage Vmin relates to its sufficiency to drive the functionality of IC device 210 and sets the lower bound of the voltage range. A maximum voltage Vmax relates to a reliability characteristic with which IC device 210 may operate and sets the upper bound of the voltage range. The values of Vmin and Vmax may be registered in memory cells of CL_DVFS 220. Thus, CL_DVFS 220 functions to request voltage levels only within these bounds.

Where the core supply voltage Vdd_cpu already has a value at Vmin and the DVCO 202 frequency Fd remains faster than the registered request target frequency Fr, CL_DVFS 220 enables one or more clock skippers. Clock skipper 2 is enabled to skip pulses, which allows an effective average frequency to achieve a value that is closer to the registered request target frequency.

Not dissimilarly, where the registered request target frequency remains excessively high, CL_DVFS 220 halts updating the voltage adjustment signal upon core supply voltage Vdd_cpu reaching (or approaching closely) the value of the maximum voltage bound Vmax, which caps DVCO 202 output frequency to a maximum value Fmax. In its closed loop operating mode, CL_DVFS system 200 displays a short term response and a long term response to di/dt noise, as discussed below with reference to FIG. 4 and FIG. 5.

CL_DVFS 220 allows system 200 to automatically program desired target frequencies. System 200 effectively functions as a feedback loop, which determines the optimal voltage automatically for a requested target frequency. Any component of IC device 210, notwithstanding its characteristics and corresponding classification in any bin, is thus run at its optimal voltage for a given frequency, which conserves power and minimizes current draw and associated local and general temperature rises. Thus, an example embodiment of the present invention provides, in effect, a per-part VID binning capability for IC device 210.

In open loop mode, a selection that relates to Clk Mux 216 is configured to enable clocking IC device 210 using the output signal Dvco_Clk from DFLL 201 as a primary clock signal. In contrast to the closed loop mode however, cycle error integrator 222 and the I²C interface are disabled.

In open loop mode, the CLK MUX is configured to select the DVCO as the primary clock source for CCPLEX. However, the error integrator and the I2C interface are disabled. The open loop mode may be used for initial calibrations and during switching in and out of the closed loop mode, such as during Vdd rail gating and power gating.

Example di/dt Noise Amelioration

Figure 4:
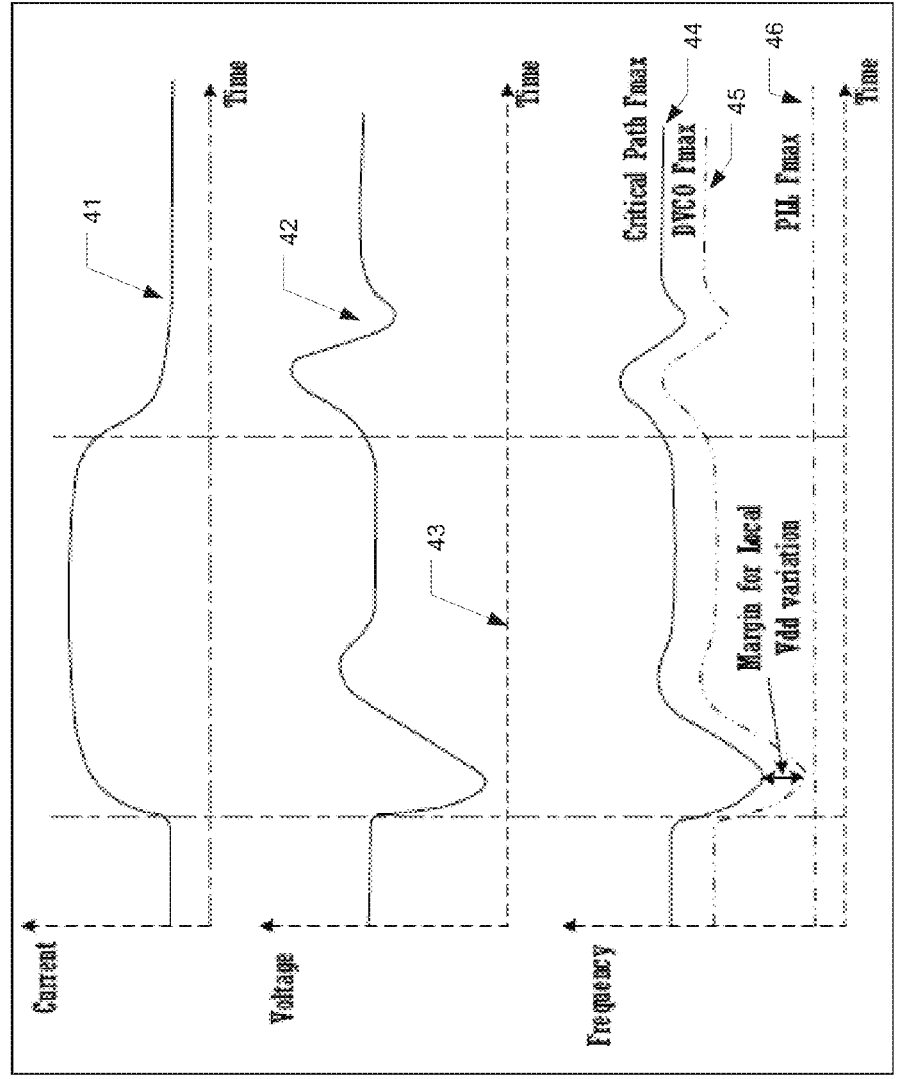
FIG. 4 depicts an example short term response to a di/dt noise transient, according to an embodiment of the present invention.

FIG. 4 depicts an example short term response 40 to a di/dt noise transient, according to an embodiment of the present invention. Sudden increases in activity of IC device 210 draws a corresponding current on its Vdd_cpu rail. The sudden current increase results in a voltage droop on the rail. Example waveform 41 represents a sudden current increase on the Vdd rail that occurs at a time T(0). Example waveform 42 represents a voltage droop on the Vdd rail that corresponds to the current increase 41. Example waveform 43 represents a frequency at which IC device 210 may operate over time, which corresponds to the transient that results from current increase 41 and/or the droop 42 in core supply voltage Vdd associated therewith In an example embodiment, DVCO 202 functions with the same core voltage supply Vdd_cpu as the critical paths of IC device 210. DVCO 202 has a frequency vs. voltage (f/v) curve 45 that matches, or is at least similar to the critical paths of IC device 210. DVCO 202 thus has a maximum operating frequency Fmax that follows a matching, conforming or at least similar f/v curve as the f/v curves of critical path Fmax 44. DVCO 201 is used to clock IC device 210 in the closed loop operating mode of system CL_DVFS 200. The DVCO 202 clock and the critical data paths of IC device 210 slowdown by an equal amount in reaction to the sudden di/dt droop. Thus, an example embodiment functions to avoid a timing failure in IC device 210.

DVCO 202 is configured to track the Fmax of the critical paths in relation to core supply voltage Vdd. To account for voltage variations that could result from local activity differences, local power grid differences, local temperature differences or other local characteristics, permanent or temporary, in relation to IC device 210 over its entirety or more generally. An embodiment is thus implements wherein the value for Fmax of DVCO 202 is margined for such local variation. When the critical path of IC device 210 is clocked from PLL 215, the value 46 of Fmax for the PLL is fixed in relation to the core supply voltage Vdd. To avoid timing failures, the value of Fmax for PLL 215 is based on the lowest possible critical path Fmax for IC device 210 and is thus significantly lower than the average Fmax 45 of DVCO 202. Thus, an example embodiment slows or stretches clock edges in a manner that is tuned to the timing of critical data paths, which avoids timing failures for IC device 210. An example embodiment thus functions to adjust the voltage of the Vdd_cpu rail to a minimum level for achieving a desired target frequency, which conserves power.

Figure 5:
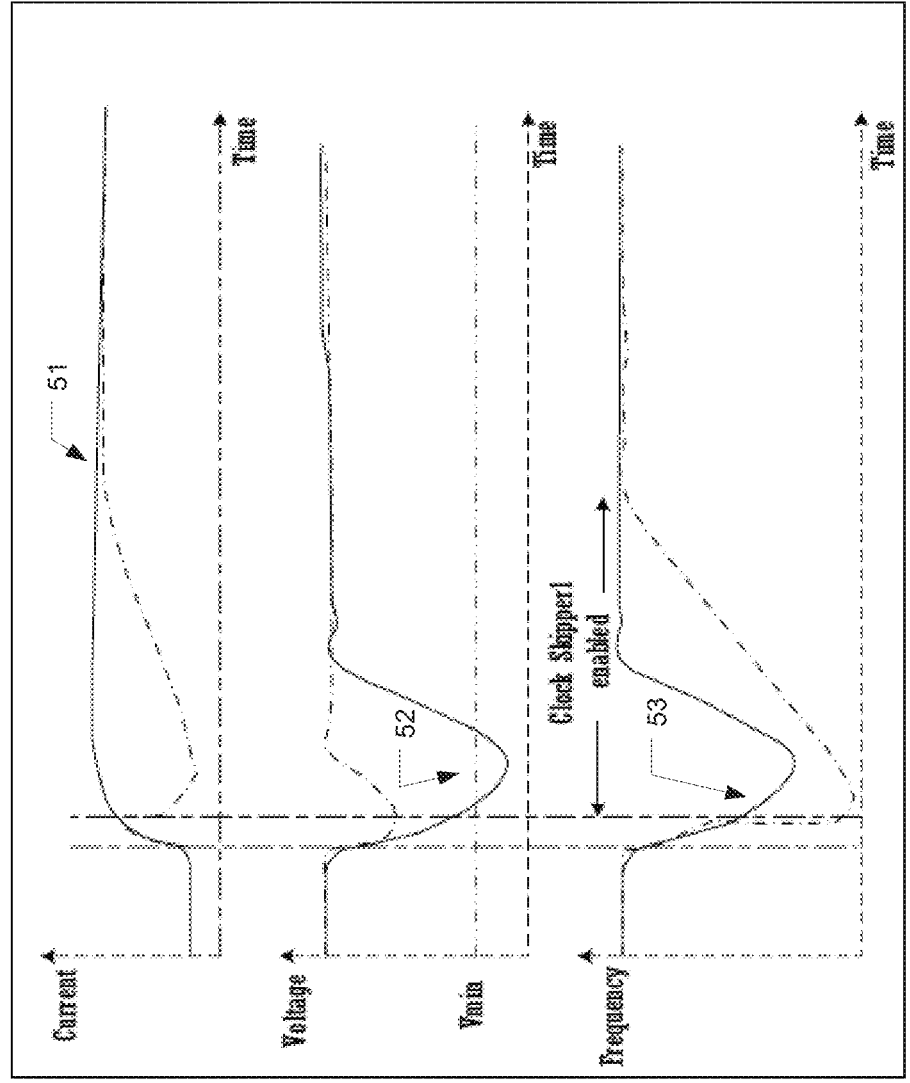
FIG. 5 depicts an example long term response to a di/dt noise transient, according to an embodiment of the present invention.

FIG. 5 depicts an example long term response 50 to a di/dt noise transient, according to an embodiment of the present invention. In an example embodiment, CL_DVFS system 200 responds to the di/dt noise with a limitation on the overall current consumption at the Vdd_cpu rail. A sudden change in activity in IC device 210 at time $T_0$ causes a surge 51 in the current drawn on the rail. The current surge di/dt noise causes a voltage droop 52. Voltage droop 52 reduces the effective operating frequency 53 of DVCO 202. Significant voltage droops can cause core supply voltage Vdd to drop below the minimum operating voltage Vmin, at which IC device 210 may be expected to lose state and fail.

In example embodiment, CL-DVFS system 200 monitors the output frequency Fd of DVCO 202. Upon Fd reaching a minimum frequency threshold, CL_DVFS system 200 triggers a clock skipping function in a first clock skipper 204. Enabling clock skipper 202 reduces the effective clock frequency, which reduces correspondingly the total current drawn by IC device 210. The reduction in the current drawn reduces the voltage droop 52. Clock skipper 204 gradually re-enables the clock pulses that it first diminished, which increases the effective frequency at a rate that is less likely to trigger a further di/dt noise events.

In an example embodiment, CL_DVFS system 200 thus limits the amount of time that IC device 210 may dwell in a situation that is characterized with high current di/dt noise and allows a more gradual, relatively noise-free increase in current. An example embodiment is implemented wherein the minimum frequency threshold is stored in a non-transitory register of CL_DVFS system 200.

Figure 6:
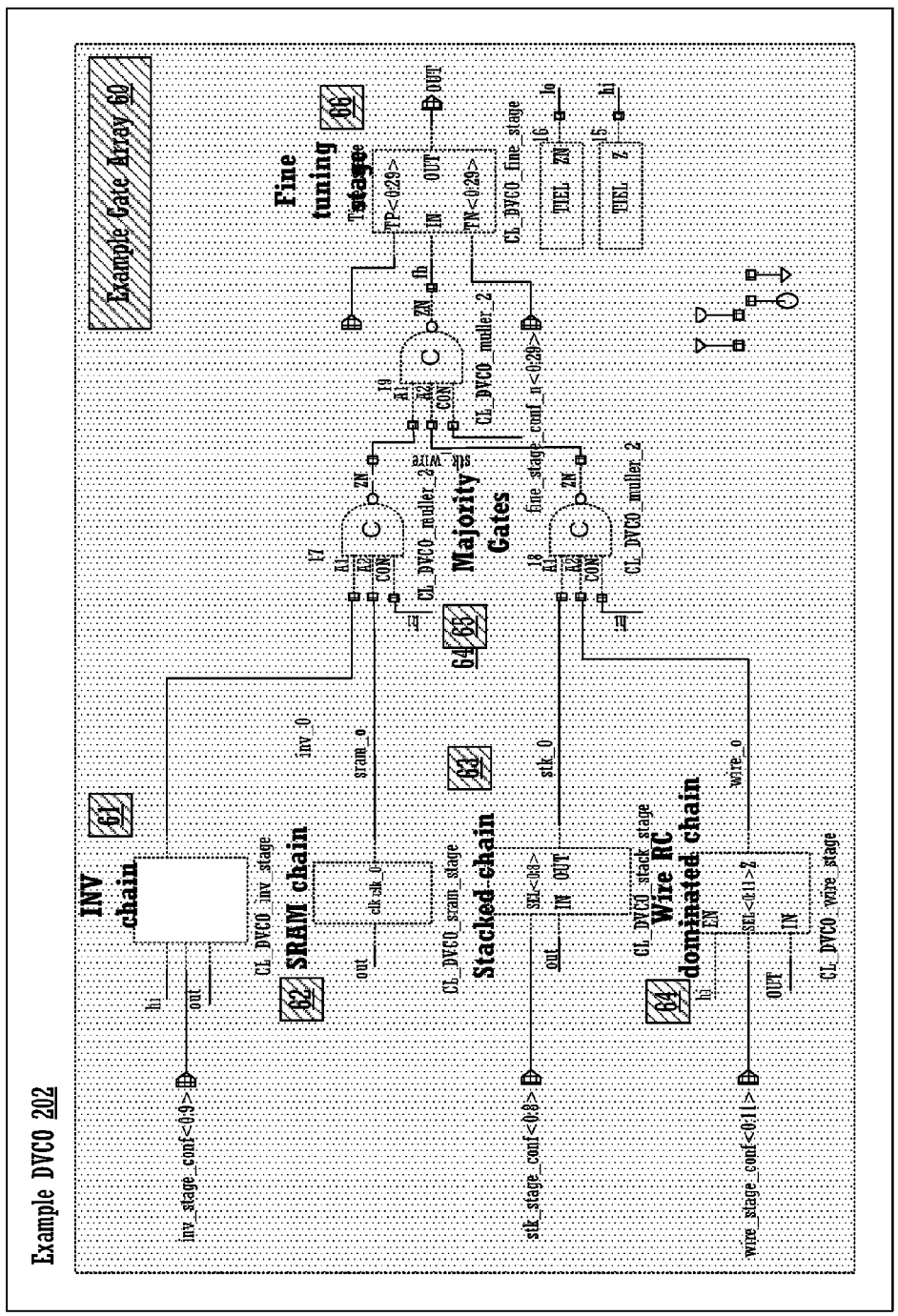
FIG. 6 depicts an example digital voltage control oscillator circuit gate array, according to an embodiment of the present invention.

In relation to its gate mix and a relative distribution of delay within its critical paths, the pathways of IC device 210 are grouped. FIG. 6 depicts an example DVCO circuit portion 600, according to an embodiment of the present invention. A group 61 is associated with predominantly static random access memory (SRAM) based paths. A group 62 is associated with predominantly stacked gate based paths, such as those that are rich in NOR logic gates and dual-input NAND logic gates. A group 63 is associated with inverter (NOT logic gates) and buffer based paths. A group 64 is associated with wire related resistive/capacitive (Wire-RC) dominated paths.

Each of the path groups 61-64, inclusive, comprises a predominant critical pathway at different ranges of core supply voltage Vdd. An example embodiment is implemented wherein registers that are associated with DFLL 201 include values that characterizer each of these path groups 61-64, inclusive, which allows system 200 to track responsively the worst-delay at any of the corresponding voltage ranges.

The chains 61-64, inclusive, are triggered by the same signal transition, which comprises the output of DVCO 202. Each of the chains 61-64, inclusive, comprise a variety of gate types. Thus, their respective delays likely differ and the transition thus appears at different times at their respective outputs. The output of each of the chains 61-64, inclusive, is connected (e.g., electrically, electronically and/or communicatively coupled) to a majority gate (or e.g., a Muller-C gate) 65, which switches upon all, each or every one of its inputs having switched.

Thus, even though the different chains 61-64, inclusive, may each have different delays, the majority gate 65 functions to toggle the output of DVCO 202 upon the toggling of the slowest critical path of IC device 210, e.g., and not before. Thus, DVCO 202 tracks the slowest critical path of IC device 210 at any given voltage. A fine-delay tuning stage 66 adjusts characteristics of DVCO 202 such as its duty-cycle and rise/fall imbalance and may output the target operating clock signal of the DVCO 202.

Component 201 comprises a DVCO 202, which performs a DFLL function that tracks a frequency vs. voltage characteristic similar to one or more critical paths of IC device 210. DVCO 202 comprises a combination 60 of different gate types 61-64, inclusive, which are each critical at voltage ranges that differ from the others. Each of the delay chains 61-64, inclusive, of DVCO 202 is independently tunable, which allows changes in the slopes and offsets of their individual delay vs. Vdd curves to be configured. DVCO component 201 also comprises an array of gates and clock skippers.

Figure 7:
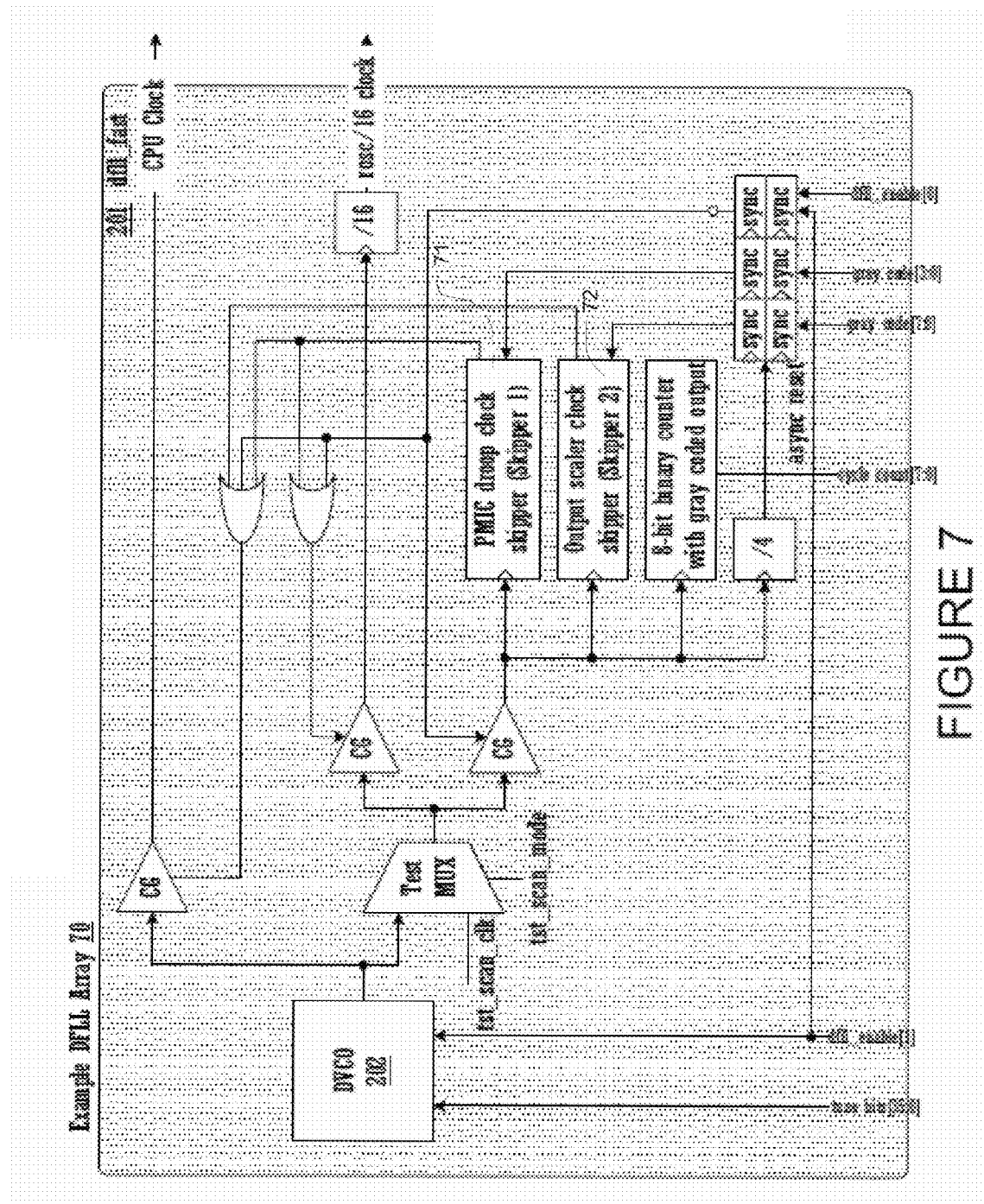
FIG. 7 depicts an example dynamic frequency locked loop array, according to an embodiment of the present invention.

FIG. 7 depicts an example DFLL array 70, according to an embodiment of the present invention. Clock skippers sense the output of DVCO 202 and function to skip pulses in various circumstances. A first clock skipper 71 detects di/dt noise and is triggered when the output frequency of DVCO 202 reaches a minimum threshold. A second clock skipper 72 generates a lower frequency than the native frequency that characterizes DVCO 202 at its minimum operating voltage Vmin.

Figure 8:
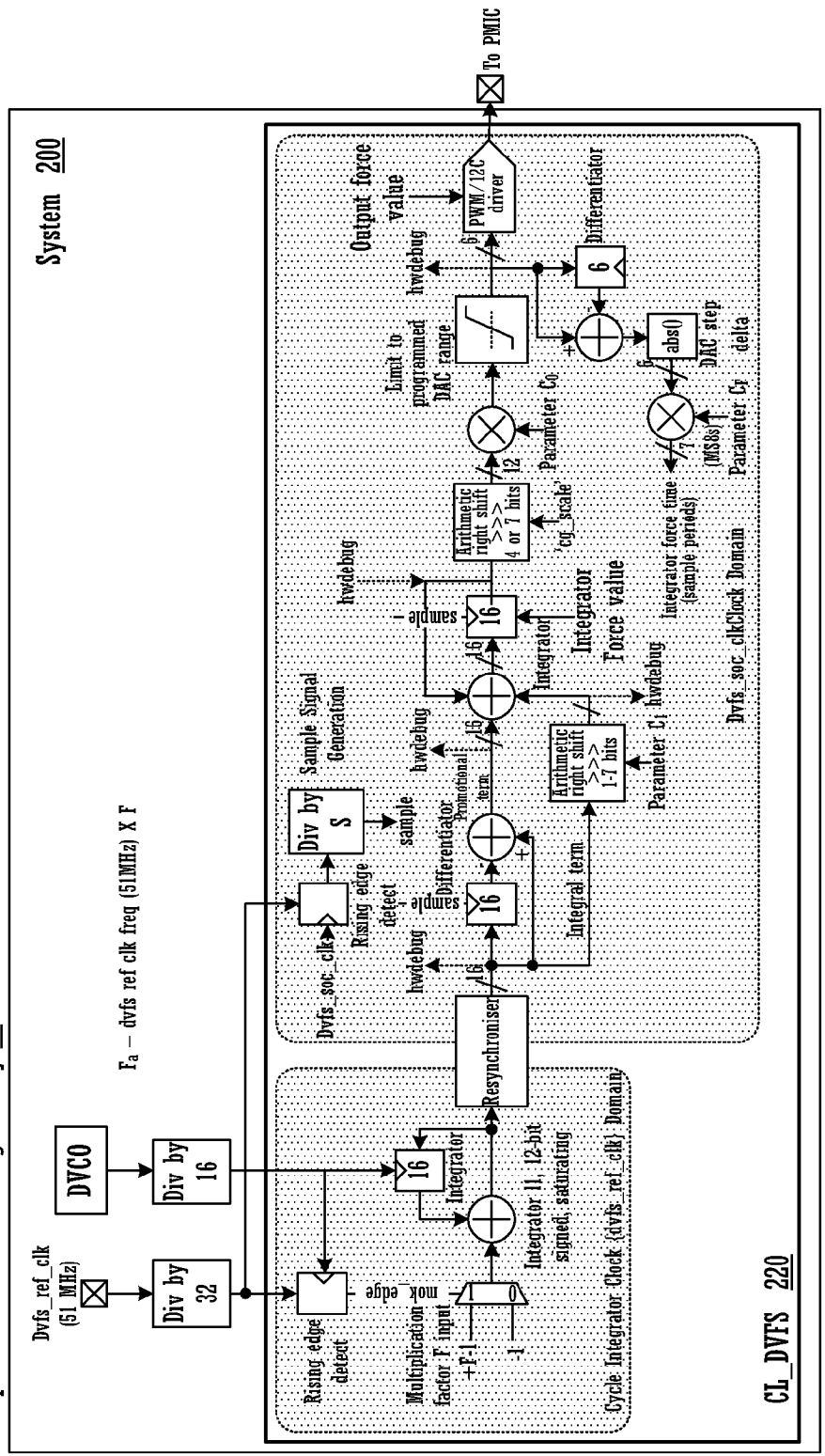
FIG. 8 depicts an example closed loop dynamic voltage and frequency scaling logic circuit, according to an embodiment of the present invention.

An embodiment may be implemented wherein CL_DVFS 220 comprises a control logic module. FIG. 8 depicts an example CL-DVFS logic circuit 80, according to an embodiment of the present invention. Control logic module 80 comprises a first clock domain dvfs_ref_clk and a second clock domain dvfs_soc_clk. The first clock domain relates to the reference signal with which cycle error integrator 222 is clocked.

The second clock domain dvfs_soc_clk relates to components of control logic module 80 apart from the cycle error integrator 222, which are clocked with the signal that clocks a system clock, e.g., timing complex CCPLEX of IC device 210. While cycle error integrator 222 operates at the relatively high clock frequency (e.g., 51 MHz) of the reference clock, the duration of the loop delay associated with another component of logic module 80 may be elongated in relation thereto.

For example, the loop delay may be somewhat elongated in duration with communication latencies that are associated with signaling PMIC 288, which is disposed elsewhere on PCB 299 in relation to IC device 210. The dvfs_soc_clk clock domain thus allows logic module 80 to interface with control registers 233. Control logic 80 is programmed to restrain generation of new voltage adjustment request values any faster than duration of the communication delay in signaling PMIC 288.

Control logic 80 comprises cycle error integrator 222, which functions to perform error detection of the frequency related errors, a differentiated error integrator 81, a force value integrator 82 and a PWM (or I$^2$C) output generator 83. Cycle error integrator 222 operates on a front end and to produce a value that is directly proportional to the clock cycle difference between the output frequency Fd of DVCO 202 and the target request frequency Fr and thus outputs a cycle error value that represents the frequency related error.

An embodiment may be implemented wherein cycle error integrator 222 comprises an integrator that adds output frequency Fd cycles from DVCO 202 and subtracts therefrom the signalled or sampled target request frequency Fr cycles. With Fr=Fd, the frequencies match and cycle error integrator 222 outputs a constant value. An embodiment may be implemented wherein the sample rate has an arbitrarily long duration (e.g., 150 μs), the output of cycle error integrator saturates at a peak value.

Control logic 80 functions to perform a differentiated error integration operation 81. The cycle error value that is generated in cycle error integrator 222 is transferred into the dvfs_soc_clk domain through a clock domain synchronizer 85. Differentiated error integration 81 differentiates the transferred cycle error value that is synchronized therewith. An example embodiment may be implemented wherein differentiated error integration operation 81 comprises subtracting a current, e.g., then-synchronized error value, from the error that was sampled and synchronized immediately previous thereto. Thus, an example embodiment computes a measurement that relates to a rate of the frequency related error, e.g., the rate of change that is associated therewith. The differentiator 81 outputs a proportional term.

In situation wherein CL_DVFS 220 skips cycles due to the operation of clock skipper 71 or clock skipper 72, the performance of IC device 210 may be degraded. An example embodiment functions to ameliorate or recover the performance by allowing DVCO 202 to run for a brief time duration at a speed that is faster than the requested target frequency. An example embodiment controls the amount and rate of output frequency overshoot from by an integrator term. For instance, the proportional term is integrated with a de-rated (divided) value of the cycle error to compute a final error value. The computed final error is scaled by an overall loop gain factor to compute a final voltage output value, which may be communicated to PMIC 288.

In a situation wherein the operating frequency of IC device 210 changes drastically, control loop 80 may compute multiple voltage steps, prior to finally settling to an ideal voltage for that frequency. The latency associated with multiple voltage step computations however may contribute to a total delay, which could exceed a delay that is tolerable for proper, reliable, error free operation of IC device 210. A force value integrator 82 speeds up the voltage transitions of control loop 80 by forcing a rough value onto the integrator, which approximates the target frequency that is currently being requested. The voltage adjustment value and time for forcing the value are programmable. After passage of the set time, the integrator is allowed to settle with the number of steps for settling its computed ideal voltage.

EQUIVALENTS, EXTENSIONS, ALTERNATIVES AND MISCELLANEOUS

Example embodiments of the present invention are thus described in relation to closed loop dynamic voltage and frequency scaling for power management in an IC device. An example embodiment of the present invention thus automatically programs desired (e.g., requested) target frequencies therein over a range of voltages and ameliorates di/dt noise. An example embodiment effectively functions with feedback, which determines the optimal voltage automatically for a requested target frequency.

A vide variety of components that comprise various IC devices, notwithstanding their respective characteristics and corresponding classifications in any of multiple bins, may thus be run at their optimal voltage over a wide range of given frequencies, which generally conserves power and minimizes current draw and associated local and general temperature rises. Thus, an example embodiment of the present invention provides, in effect, a per-part VID binning capability for an IC device.

Example embodiments are described in relation to closed loop dynamic voltage and frequency scaling for power management in an IC device. In the foregoing specification, example embodiments of the present invention are described with reference to numerous specific details that may vary between implementations. Thus, the sole and exclusive indicator of that, which embodies the invention, and is intended by the Applicants to comprise an embodiment thereof, is the set of claims that issue from this application, in the specific form in which such claims issue, including any subsequent correction.

Definitions that are expressly set forth in each or any claim specifically or by way of example herein, for terms contained in relation to features of such claims are intended to govern the meaning of such terms. Thus, no limitation, element, property, feature, advantage or attribute that is not expressly recited in a claim should limit the scope of such claim in any way. The specification and drawings are, accordingly, to be regarded in an illustrative rather than a restrictive sense.

What is claimed, is:

1. A system that is disposed on an integrated circuit (IC), which functions with a core supply voltage, the system comprising:
a first component comprising a voltage controlled oscillator (VCO) and configured to generate a clock signal for clocking the IC at a target operating clock frequency for operation, wherein the VCO is configured to output the clock signal, wherein a period that corresponds to the target operating clock frequency exceeds a duration of a longest critical path associated with the IC, and wherein the first component and a synchronous logic component of the IC clocked therewith each function with the core supply voltage supplied to the first component and the synchronous logic component from a same power supply rail; and
a second component configured to detect frequency related errors related to an operation of the IC at the target operating clock frequency, wherein the second component is configured to determine a level for adjusting the core supply voltage to reduce the frequency related errors.

2. The system as recited in claim 1, wherein the VCO is a digitally parameterizable voltage controlled oscillator (DVCO) that is configured to output the clock signal; based on a determined level for adjusting the core supply voltage.

3. The system as recited in claim 2, wherein the second component is further configured to:
control the DVCO based on the determined level for adjusting the core supply voltage; and
output a signal that corresponds to the determined level for adjusting the core supply voltage.

4. The system as recited in claim 3 further comprising an entity for controlling or regulating the core supply voltage based on an output signal and the determined level for adjusting the core supply voltage.

5. The system as recited in claim 4, wherein the entity comprises a component that is independent of the IC.

6. The system as recited in claim 4, wherein the entity comprises a power management IC (PMIC) component.

7. The system as recited in claim 4, wherein the second component provides the output signal, which corresponds to the determined level for adjusting the core supply voltage, to the entity.

8. The system as recited in claim 2, wherein the frequency related errors comprise a deviation of an output frequency of the DVCO from the target operating clock frequency.

9. The system as recited in claim 8, wherein the second component comprises a cycle-error integrator configured to detect the frequency related errors that relate to an operation of the IC at the target operating clock frequency.

10. The system as recited in claim 2 wherein the second component further comprises a register storing a value that relates to one or more of:
the target operating clock frequency;
a parameter that relates to tuning the second component; and
a parameter that relates to a gain achieved in the second component.

11. A method for controlling a core supply voltage of an integrated circuit (IC), the method comprising:
generating a clock signal by a first component using a voltage controlled oscillator (VCO) for clocking the IC at a target operating clock frequency, wherein a period that corresponds to the target operating clock frequency exceeds a duration of a longest critical path associated with the IC, and wherein the first component and a synchronous logic component of the IC clocked therewith each function with the core supply voltage;
detecting frequency related errors that relate to an operation of the IC at the target operating clock frequency; and
determining a level for adjusting the core supply voltage wherein the core supply voltage adjustment ameliorates the frequency related errors, wherein the determining comprises using closed loop dynamic voltage and frequency scaling.

12. The method as recited in claim 11, wherein the generating comprises using a dynamic voltage controlled oscillator (DVCO) that, based on a determined level for adjusting the core supply voltage, outputs the clock signal.

13. The method as recited in claim 12, wherein the determining comprises:
controlling the DVCO, based on the determined level for adjusting the core supply voltage; and
outputting and output signal that corresponds to the determined level for adjusting the core supply voltage.

14. The method as recited in claim 13, wherein the determining functions with an entity that controls or regulates the core supply voltage based on the output signal and the determined level for adjusting the core supply voltage.

15. The method as recited in claim 14, wherein the entity comprises a component that is independent of the IC.

16. The method as recited in claim 14, wherein the entity comprises a power management IC (PMIC) component.

17. The method as recited in claim 14 further comprising providing the output signal, corresponding to the determined level for adjusting the core supply voltage, to the entity.

18. The method as recited in claim 12, wherein the frequency related errors comprise a deviation of an output frequency of the DVCO from the target operating clock frequency.

19. The method as recited in claim 12 wherein the detecting frequency related errors, which relate to an operation of the IC at the target operating clock frequency, comprises using cycle-error integration.

20. The method as recited in claim 12, wherein one or more of the detecting or the determining comprises storing a value that relates to one or more of:
the target operating clock frequency;
a parameter that relates to tuning the determination of the level for adjusting the core supply voltage; and
a parameter that relates to a gain, which is achieved in the determining of the level for adjusting the core supply voltage.

21. A circuit, comprising:
means for supplying a core supply voltage to a plurality of components of an integrated circuit (IC) device;
means for generating a clock signal for clocking the IC at a target operating clock frequency, wherein the means for generating the clock signal comprises a voltage controlled oscillator (VCO), wherein a period that corresponds to the target operating clock frequency exceeds a duration of a longest critical path associated with the IC, wherein (a) a first component, and (b) a synchronous logic component of the IC clocked therewith, each functions with the core supply voltage, and wherein the plurality of components supplied with the core supply voltage by the means for supplying a core voltage comprises the first component and the synchronous logic component clocked therewith;
means for detecting frequency related errors that relate to an operation of the IC at the target operating clock frequency by clock-error integration; and
means for determining a level for adjusting the core supply voltage wherein a core supply voltage adjustment ameliorates the frequency related error, wherein the means for determining a level for adjusting is operable to use closed loop dynamic voltage and frequency scaling.

22. An integrated circuit (IC) device that functions with a core supply voltage, the IC comprising:
a semiconductor die; and
an array of active devices that are disposed in the semiconductor die and configured or programmed to function as a system that comprises:
a first component for generating a clock signal by using a voltage controlled oscillator (VCO) for clocking the IC at a target operation clock frequency for operation, wherein a period that corresponds to the target operation clock frequency exceeds a duration of a critical path function or operation of the IC, and wherein the first component functions with the core supply voltage; and
a second component comprising a clock-error integrator for detecting frequency related errors that relate to an operation of the IC at the target operating clock frequency and for determining a level for adjusting a core supply voltage wherein the core supply voltage adjustment ameliorates the frequency related errors, wherein the voltage determining comprises using closed loop dynamic voltage and frequency scaling.

\* \* \* \* \*